United States Patent
Studnicki

(10) Patent No.: US 9,103,877 B2
(45) Date of Patent: Aug. 11, 2015

(54) APPARATUS AND METHOD FOR IDDQ TESTS

(75) Inventor: Richard Studnicki, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 675 days.

(21) Appl. No.: 13/438,745

(22) Filed: Apr. 3, 2012

(65) Prior Publication Data

US 2013/0262018 A1    Oct. 3, 2013

(51) Int. Cl.
*G01R 31/30* (2006.01)

(52) U.S. Cl.
CPC ................... *G01R 31/3008* (2013.01)

(58) Field of Classification Search
CPC .................................................. G01R 31/3008
USPC ....................................................... 702/117
See application file for complete search history.

(56) References Cited

U.S. PATENT DOCUMENTS

| | | | |
|---|---|---|---|
| 4,092,589 A | 5/1978 | Chau et al. | |
| 4,142,142 A | 2/1979 | Arce | |
| 5,371,457 A | 12/1994 | Lipp | |
| 7,262,623 B1 | 8/2007 | Mark et al. | |
| 7,688,100 B2 | 3/2010 | Priel et al. | |
| 2009/0315583 A1 | 12/2009 | Rius Vazquez et al. | |
| 2011/0187396 A1* | 8/2011 | Jarrige et al. | 324/750.3 |

* cited by examiner

*Primary Examiner* — Bryan Bui
(74) *Attorney, Agent, or Firm* — Martine Penilla Group, LLP

(57) ABSTRACT

A method for conducting IDDQ tests for a device having a plurality of test sites is disclosed. The method includes identifying voltage ranges for each of the plurality of test sites, closing a switch in each of a plurality of voltage drop setup circuits, and setting each of the plurality of test sites to one of a plurality of logic states. Each of the plurality of voltage drop setup circuits includes a resistor parallelly coupled to the switch. One terminal of each voltage drop setup circuit is coupled to a voltage source and the other terminal of each voltage drop setup circuit is coupled to respective tester channels of each of the plurality of test sites. After opening the switch in each of the plurality of voltage drop setup circuits, the voltage drop across the resistor in each voltage drop setup circuit is measured.

16 Claims, 7 Drawing Sheets

APPARATUS AND METHOD FOR IDDQ TESTS

BACKGROUND

Performed at the wafer sort level in production, an IDDQ test is a method for detecting the presence of manufacturing faults in CMOS integrated circuits. The IDDQ test measures the quiescent leakage current of dies at a logic state in order to determine whether potentially malfunctioning circuitry exist in an integrated circuit device. Such a defective circuit may operate properly at a time of the test. However, due to reliability defects, it may cause a premature malfunction of the integrated circuit device.

A typical IDDQ test is implemented by taking a multitude of current measurements, covering approximately 95% of logic states of an integrated circuit device. Due to the number of testes, IDDQ current measurement processes can take a considerable amount of time. It is within this context that the present invention arises.

SUMMARY

Embodiments of the present disclosure provide methods and systems for conducting IDDQ tests for devices under test. It should be appreciated that the present disclosure can be implemented in numerous ways, such as a process, an apparatus, a system, a device or a method on a computer readable medium. Several inventive embodiments of the present disclosure are described below.

In one embodiment, a method for conducting IDDQ tests for a device under test having a plurality of test sites is disclosed. The disclosed method includes identifying voltage ranges for each of the plurality of test sites, closing a switch in each of a plurality of voltage drop setup circuits, and setting each of the plurality of test sites to one of a plurality of logic states. Each of the plurality of voltage drop setup circuits includes a resistor parallelly coupled to the switch. A first terminal of each of the plurality of voltage drop setup circuits is coupled to a voltage source and a second terminal of each of the plurality of voltage drop setup circuits is coupled to respective tester channels of each of the plurality of test sites. After opening the switch in each of the plurality of voltage drop setup circuits, the voltage drop across the resistor in each of the plurality of voltage drop setup circuits is measured. The method further includes determining if an IDDQ test fails for each of the plurality of test sites and repeating the closing, the bringing, the opening, the determining operations until all of the plurality of logic states to be tested for each of the plurality of test sites are tested.

In another embodiment, an IDDQ test circuit is disclosed. The disclosed IDDQ test circuit includes a voltage drop setup circuit having a switch and a resistor, where the switch is parallelly coupled to the resistor. A first terminal of the voltage drop setup circuit is coupled to a voltage source and a second terminal of the voltage drop setup circuit is coupled to a tester channel of a test site in a testing device. In one embodiment, the disclosed circuit further includes a pin electronic ("PE") comparator coupled to the second terminal of the voltage drop setup circuit. The PE comparator is configured to measure a voltage drop across the resistor in the voltage drop setup circuit.

Other aspects and advantages of the invention will become more apparent from the following detailed description, taken in conjunction with the accompanying drawings, illustrating by way of example the present invention.

BRIEF DESCRIPTION OF THE DRAWINGS

The disclosure may best be understood by reference to the following description taken in conjunction with the accompanying drawings.

DETAILED DESCRIPTION

The following description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in a simple block diagram format in order to avoid unnecessarily obscuring the present disclosure. Thus, the specific details set forth are merely exemplary. Particular implementations may vary from these exemplary details and still be contemplated to be within the spirit and scope of the present disclosure.

Reference in the description to "one embodiment" or "an embodiment" means that a particular feature, structure, or characteristic described in connection with the embodiment is included in at least one embodiment of the disclosure. The appearances of the phrase "in one embodiment" in various places in the specification do not necessarily all refer to the same embodiment.

Embodiments of a system and a method are described for conducting IDDQ tests for devices under test. In one embodiment, a method for conducting IDDQ tests for a device under test (DUT) having a plurality of test sites is disclosed. Each test site is coupled with a voltage drop setup circuit that includes a resistor and a switch that is parallelly coupled with the resistor. One terminal of each of the plurality of voltage drop setup circuits is coupled to a voltage source and the other terminal of each of the plurality of voltage drop setup circuits is coupled to respective tester channels of each of the plurality of test sites.

The disclosed method includes identifying voltage ranges for each of the plurality of test sites, closing a switch in each of a plurality of voltage drop setup circuits, and setting each of the plurality of test sites to one of a plurality of logic states. After the switch in each of the plurality of voltage drop setup circuits is opened, the voltage drop across the resistor in reach of the plurality of voltage drop setup circuits is measured. The disclosed method further includes determining if an IDDQ test fails for each of the plurality of test sites and repeating the test process until all or pre-determined number of logic states of each test sites is tested.

Figure 1:
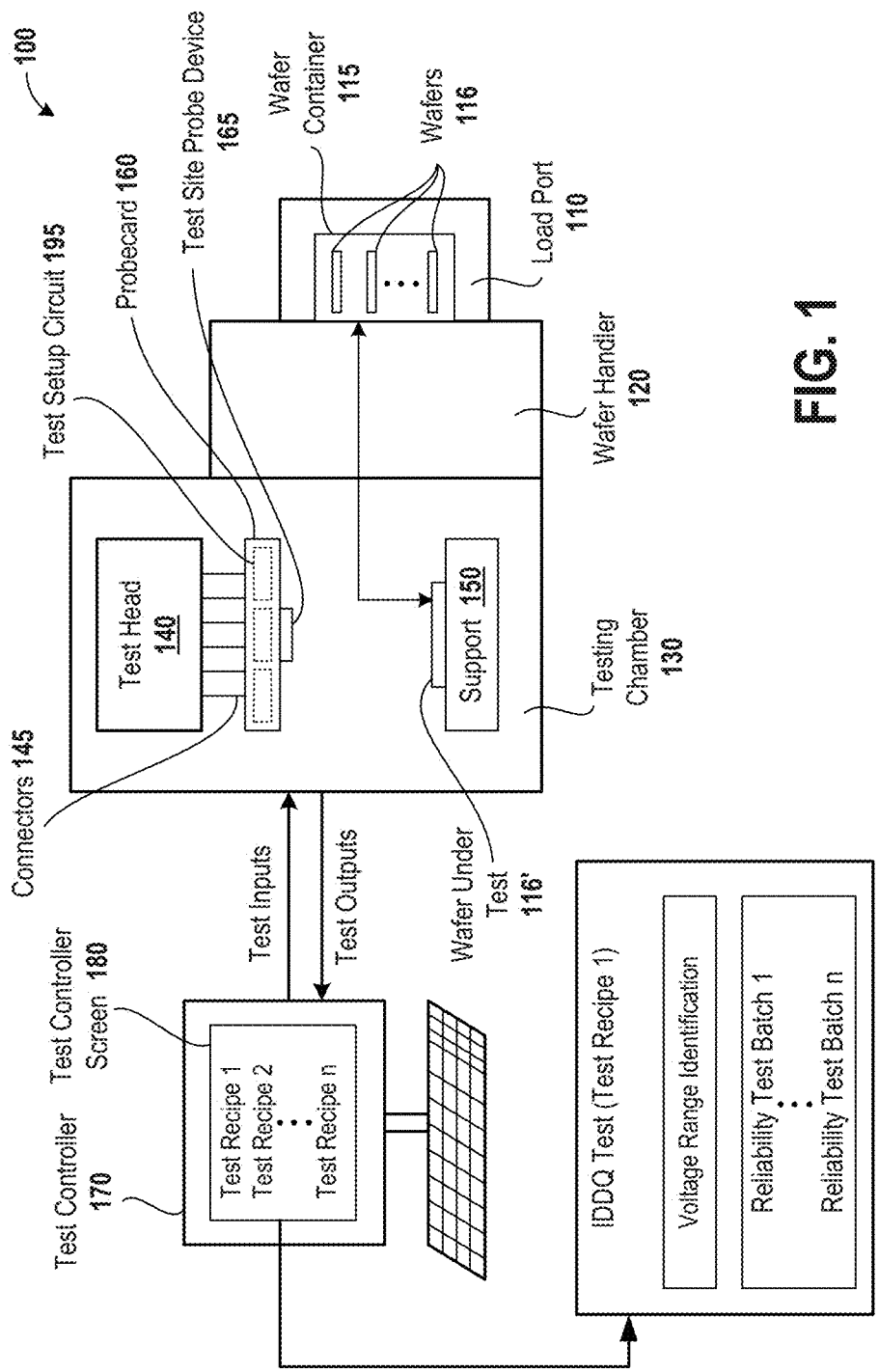
FIG. 1 shows a system for IDDQ tests, in accordance with one embodiment of the present invention.

FIG. 1 shows a system 100 for IDDQ tests, in accordance with one embodiment of the present invention. The system 100 includes a load port 110, a wafer handler 120, a testing chamber 130, and a test controller 170. The load port 110 includes a wafer container 115 that holds a plurality of wafers 116 to be tested. The testing chamber 130 includes a support 150, a test head 140, and a probecard 160. The top side of the probecard 160 is coupled to the test head 140 via the connectors 145. In one embodiment, the probecard 160 is circular in shape. In the example illustrated in FIG. 1, the probecard 160 further includes a test site probe device 165 and a plurality of test setup circuits 195. The probecard 160 will be discussed in more details in FIG. 2.

As shown in FIG. 1, one end of the wafer handler 120 is coupled with the testing chamber 130 and the other end of the wafer handler 120 is coupled to the load port 110. The wafer handler 120 is configured to retrieve a wafer under test 116' from the plurality of wafers 116 in the wafer container 115. The retrieved wafer under test 116' is put on the top of the support 150 by the wafer handler 120. In one embodiment, after the tests on the wafer under test 116' have been completed, the wafer handler 120 is configured to remove the wafer under test 116' from the support 150 to put the wafer under test 116' back to the wafer container 115.

In one embodiment, the testing chamber 130 including the test head 140 and the support 150, the wafer handler 120, and the load port 110 including the wafer container 115 are controlled by the test controller 170. The test controller 170 may be configured to include a plurality of test recipes (test recipe 1, test recipe 2, . . . test recipe n), which may be displayed on the test controller screen 180. In one embodiment, the plurality of test recipes is IDDQ tests. In the example illustrated in FIG. 1, the IDDQ test, i.e., test recipe 1, includes a voltage range identification process and a reliability test batch set. In one embodiment, the test controller 170 may send test inputs to the testing chamber 130 based on a test recipe and receive the test outputs or test results from the test chamber 130 after a test is completed. In one embodiment, the test controller 170 may also control the movement of the test head 140 in the testing chamber 130. For example, during a test run, the test head 140 may be controlled to move downwards so that the test site probe device 165 may come into contact with a portion of the wafer under test 116' disposed on the top of the support 150. After the specified portion of the wafer under test 116' is tested, the test head 140 may be controlled to move towards another portion of the wafer under test 116' until all dies in the wafer under test 116' are tested.

Figure 2:
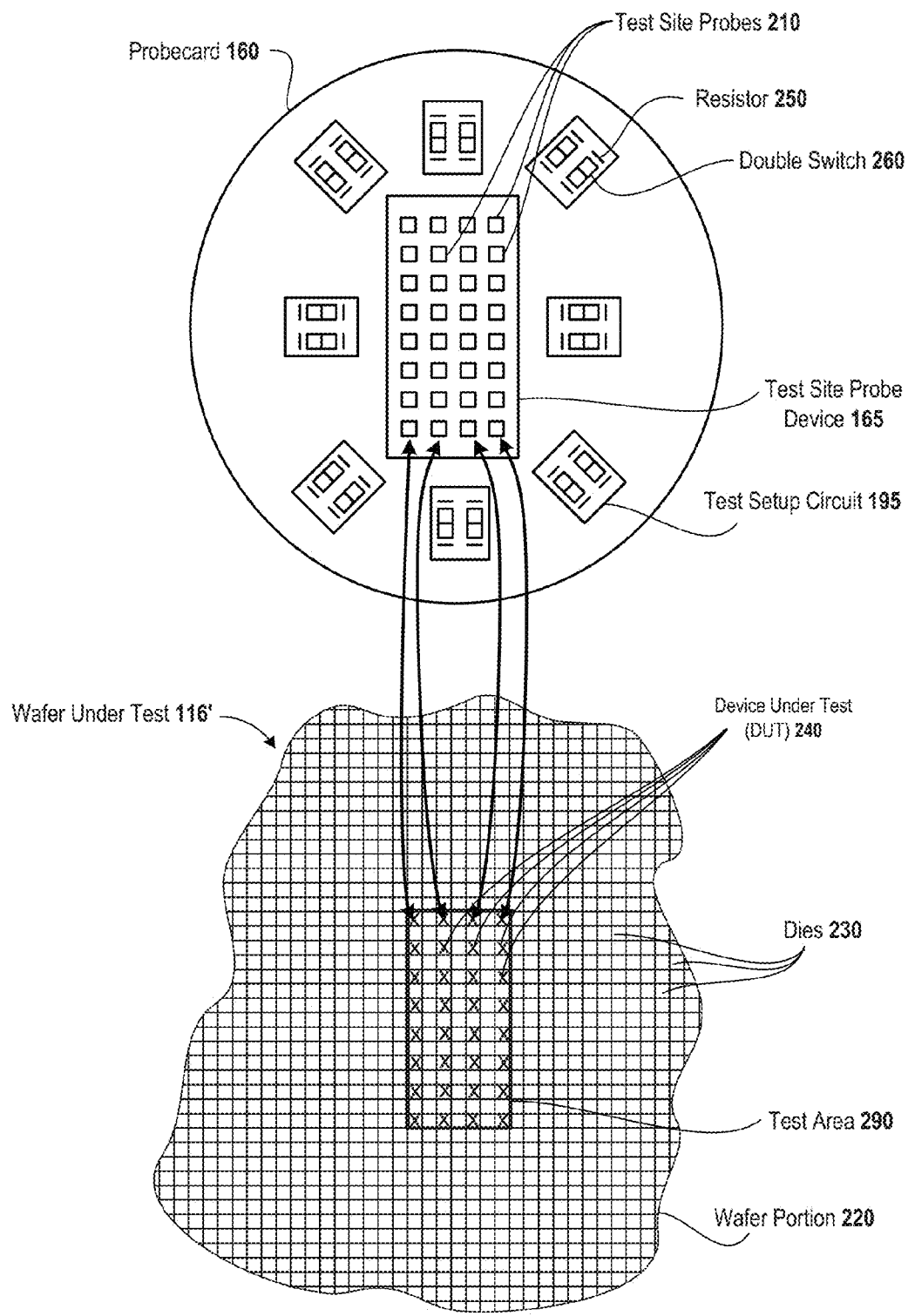
FIG. 2 illustrates a probecard and a wafer portion, in accordance with one embodiment of the present invention.

FIG. 2 illustrates a probecard 160 and a wafer portion 220 in accordance with one embodiment of the present invention. In this embodiment, the wafer portion 220 may be part of the wafer under test 116', as shown in FIG. 1. The wafer portion 220 includes a plurality of dies 230. In the example illustrated in FIG. 2, the probecard 160, circular in shape, includes 8 test setup circuits 195 evenly spaced around circumference of the probecard 160. The probecard 160 further includes a test site probe device 165 located in the middle of the probecard 160. In one embodiment, the test site probe device 165 includes 32 test site probes 210. During a test, the test site probes 210 of the test site probe device 165 in the probecard 160 come into contact with the tested dies or devices under test (DUTs) 240 in the test area 290 of the wafer portion 220. In this embodiment, there are 32 DUTs 240 (marked as "x") inside the test area 290. In one embodiment, each of the test setup circuits 195 includes 4 resistors 250 and 2 double switches 260 with each switch parallelly coupled to a corresponding resistor in a test setup circuit 195. Each test setup circuit 195 may include four voltage drop setup circuits 320 as illustrated in FIG. 3.

Figure 3:
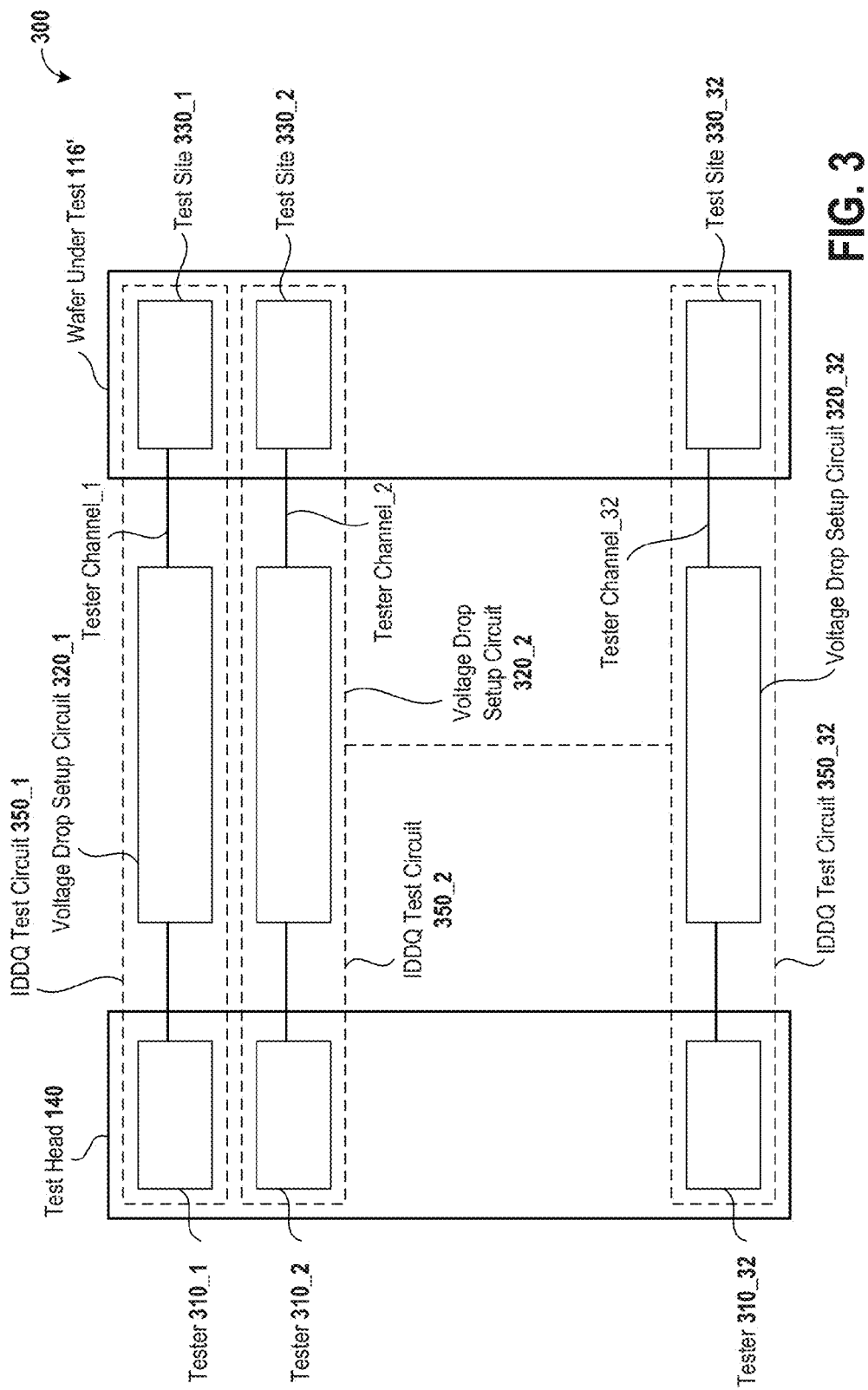
FIG. 3 illustrates a block diagram of an IDDQ test system, in accordance with one embodiment of the present invention.

FIG. 3 illustrates a block diagram of an IDDQ test system 300, in accordance with one embodiment of the present invention. In the embodiment shown in FIG. 3, the IDDQ test system 300 is capable of testing 32 test sites at a time. The IDDQ test system 300 includes 32 IDDQ test circuits 350_1 to 350_32. Each IDDQ test circuit includes a tester 310, a voltage drop setup circuit 320, and a test site 330, where the tester 310 is coupled to the test site 330 via a corresponding voltage drop setup circuit 320. The voltage drop setup circuit 320 is coupled to a test site via a corresponding tester channel. In one embodiment, the 32 testers 310_1 to 310_32 are located inside the test head 140 and each of the 32 test sites 330_1 to 330_32 is located inside a DUT 240 within the test area 290 as shown in FIG. 2, which is part of the wafer under test 116' in FIG. 1.

An IDDQ test for a test site inside a DUT on the wafer under test 116' may be conducted by receiving the test inputs from a corresponding tester in the test head 140 via a corresponding voltage drop setup circuit 320. In one embodiment, the test inputs are voltage signals generated from a voltage source located inside the tester. In another embodiment, a tester in the test head 140 may be configured to receive or measure the test outputs. In one example, the test outputs are voltage drop signals.

Figure 4A:
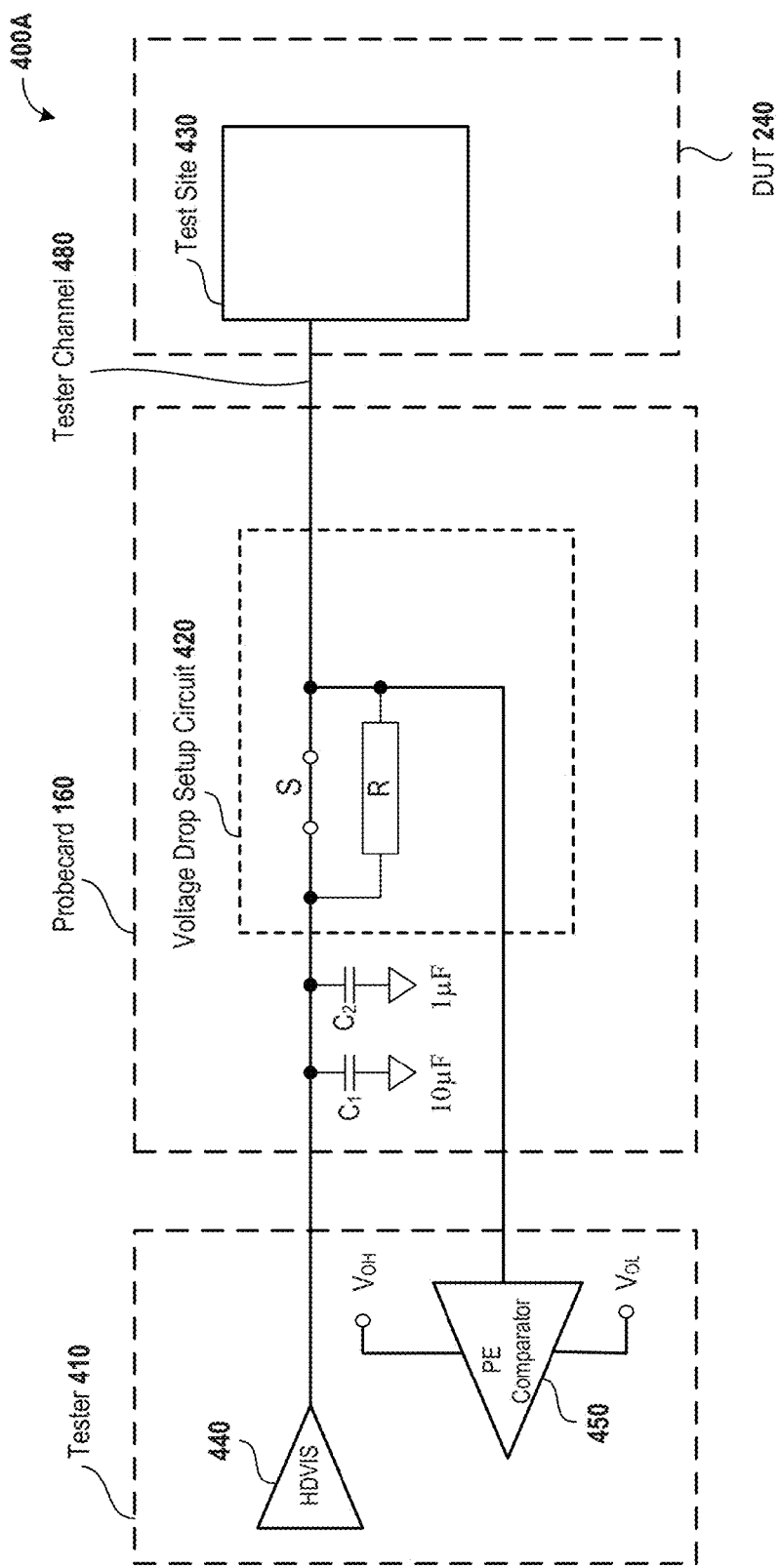
FIG. 4A illustrates an IDDQ test circuit, in accordance with one embodiment of the present invention.

FIG. 4A illustrates an IDDQ test circuit 400A, in accordance with one embodiment of the present invention. The IDDQ test circuit 400A includes a tester 410, a voltage drop setup circuit 420, and a test site 430. The tester 410 is coupled to the test site 430 via the voltage drop setup circuit 420. The Tester 410 includes a High Density Voltage/Current Source ("HDVIS") 440 and a Pin Electronics ("PE") comparator 450. The voltage drop setup circuit 420 includes a resistor R, a switch S, and two capacitors C1 and C2. The resistor R and the switch S are parallelly coupled with each other. The capacitor C1 and the capacitor C2 are coupled to one of the terminals of the resistor and switch pair in parallel. The capacitors C1 and C2 serve as noise decoupling and voltage stabilizing component for the HDVIS voltage source. Another terminal of the resistor and switch pair is coupled to the test site 430 via a tester channel 480. In one embodiment, the resistor R in the voltage drop setup circuit 420 is about 1 to 2 kohm, the switch S in the voltage drop setup circuit 420 is a NMOS switch, and the two capacitors C1 and C2 are 10 uf and 1 uf, respectively. In one embodiment, the PE comparator 450 is configured to measure the voltage drop across the resistor R in the voltage drop setup circuit 420 after the switch S is open.

At the beginning of an IDDQ test, the voltage ranges, i.e., voltage output high ("VOH") and voltage output low ("VOL"), of the test site 430 need to be identified. The identified VOH and VOL will be applied to the PE comparator 450. In one embodiment, the voltage range identification is conducted by a calibration process. The voltage range identification process will be explained in details in FIG. 5.

In one embodiment, the switch S is closed when the test site 430 is brought to a logic state at which the quiescent leakage current is to be measured. Then, the switch S is opened so that the voltage drop across the resistor R may be measured by the PE comparator 450. Because the voltage drop over the resistor R is caused by a quiescent leakage current, the voltage drop is proportional to the quiescent leakage current. The quiescent leakage current may be obtained by dividing the measured voltage drop across the resistor R with the value of the resistor R. In one embodiment, the resistor R is about 1 kohm and the switch S is a NMOS switch.

In the example shown in FIG. 4A, the voltage drop setup circuit 420 is located on the Probecard 160 as shown in FIG. 1 and FIG. 2, and the test site 430 is a tested die or DUT inside the test area of the wafer under test 116'. In one embodiment, the tester 410 may be located inside a test head, for example, the test head 140 as shown in FIG. 1 and FIG. 3.

Figure 4B:
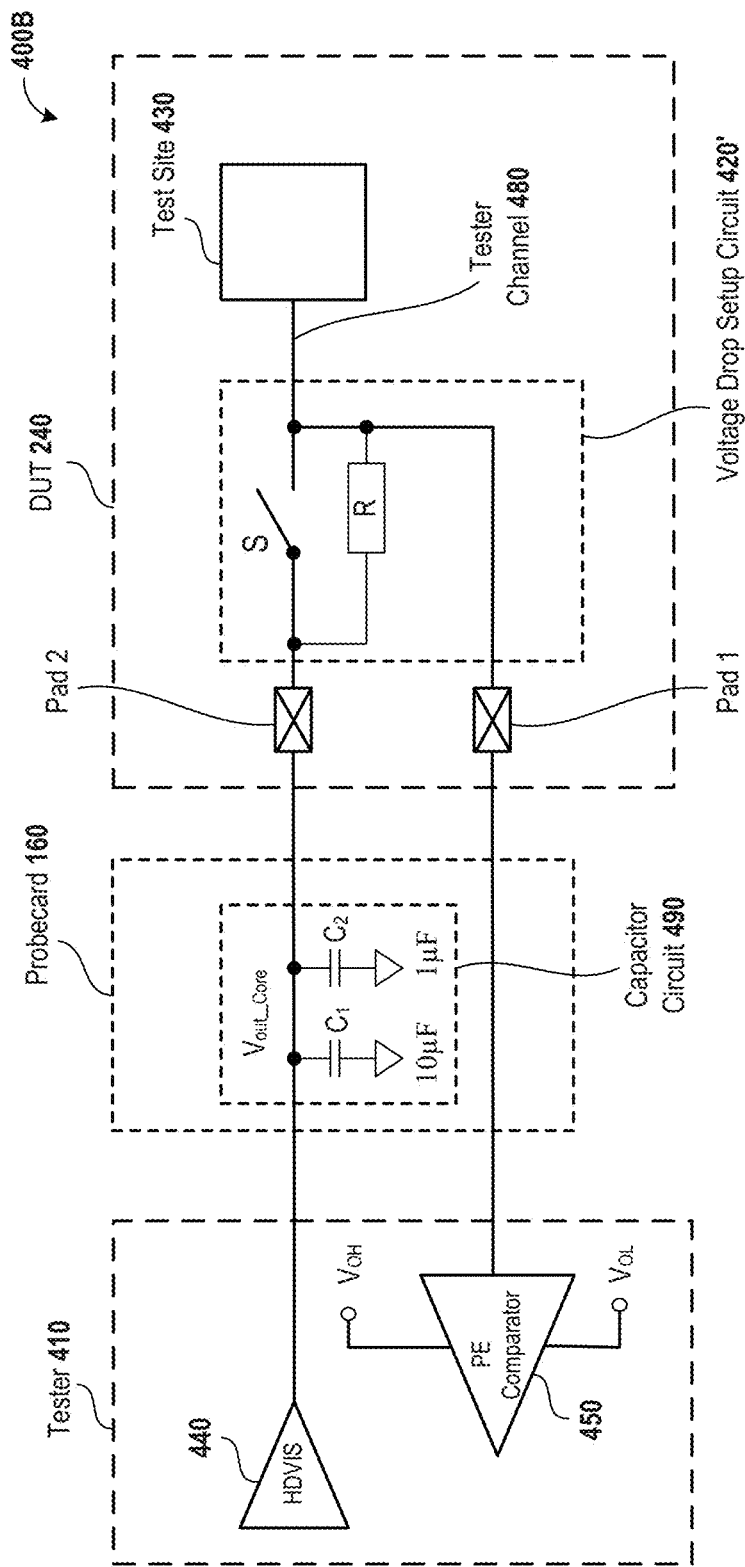
FIG. 4B illustrates an IDDQ test circuit, in accordance with one embodiment of the present invention.

FIG. 4B illustrates an IDDQ test circuit 400B, in accordance with one embodiment of the present invention. The test circuit 400B includes a tester 410, a capacitor circuit 490, a voltage drop setup circuit 420' embedded into a DUT, and a test site 430. The tester 410 is coupled to the test site 430 via the voltage drop setup circuit 420' and the capacitor circuit 490. The capacitor circuit 490 includes two parallelly coupled capacitors C1 and C2. In one embodiment, the capacitor C1 is about 10 uf and the capacitor C2 is about 1 uf. The voltage drop setup circuit 420' communicates with the external tester 410 and the capacitor circuit 490 via the die pads (pad 1 and pad 2).

The voltage drop setup circuit 420' includes a resistor R, a switch S. The resistor R and the switch S are parallelly coupled with each other. One terminal of the resistor R and the switch S pair is coupled to the capacitor circuit 490 via the pad 1, and the other terminal of the resistor R and the switch S pair is coupled to both the test site 430 via the tester channel 480 and the PE comparator 450 via the pad 2.

In one embodiment, the voltage drop setup circuit 420' and the test site 430 are located inside the DUT 240 and the capacitor circuit 490 is located on the probecard 160. Compared with the IDDQ test circuit 400A in FIG. 4A, the IDDQ test circuit 400B would save the space on the Probecard 160 and reduce the discrete components costs. Such arrangement would also increase the voltage measurement accuracy, thus improving the test.

Figure 4C:
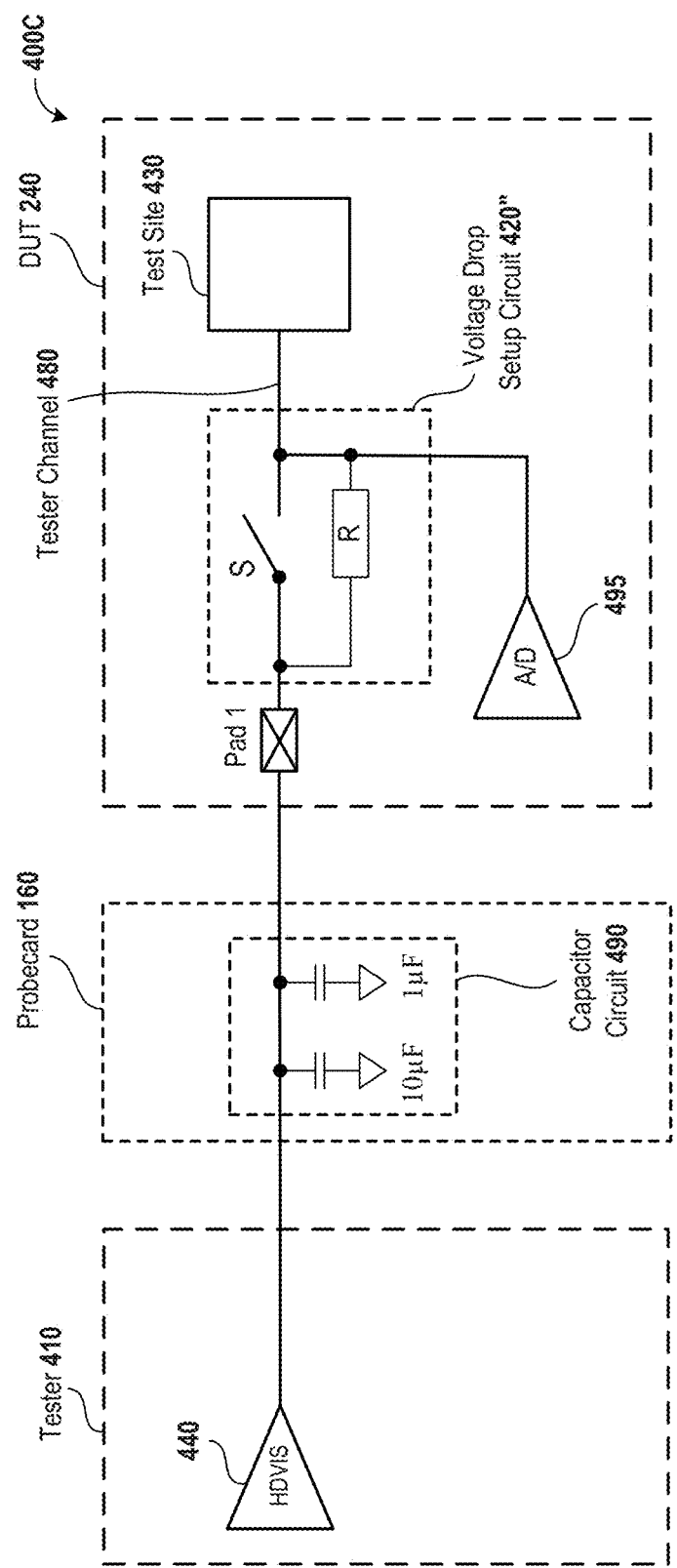
FIG. 4C illustrates an IDDQ test circuit, in accordance with one embodiment of the present invention.

FIG. 4C illustrates an IDDQ test circuit 400C, in accordance with one embodiment of the present invention. As shown, the voltage drop setup circuit 420" includes a resistor R and a switch S, which is incorporated within the DUT 240. The resistor R and the switch S of the voltage drop setup circuit 420" are parallelly coupled with each other. One terminal of the resistor and switch pair is coupled to pad 1 that in turn is coupled to the capacitor circuit 490. The other terminal of the resistor and switch pair is coupled to both the test site 430 via the tester channel 480 and an A/D circuitry 495. The A/D circuitry 495 is configured to measure the voltage drop across the resistor R automatically and is incorporated within the DUT. Compared with the IDDQ test circuit 400B, the IDDQ test circuit 400C employs one die pad (pad 1) instead of two pads, which reduces the test time to below about 0.5 sec.

Figure 5:
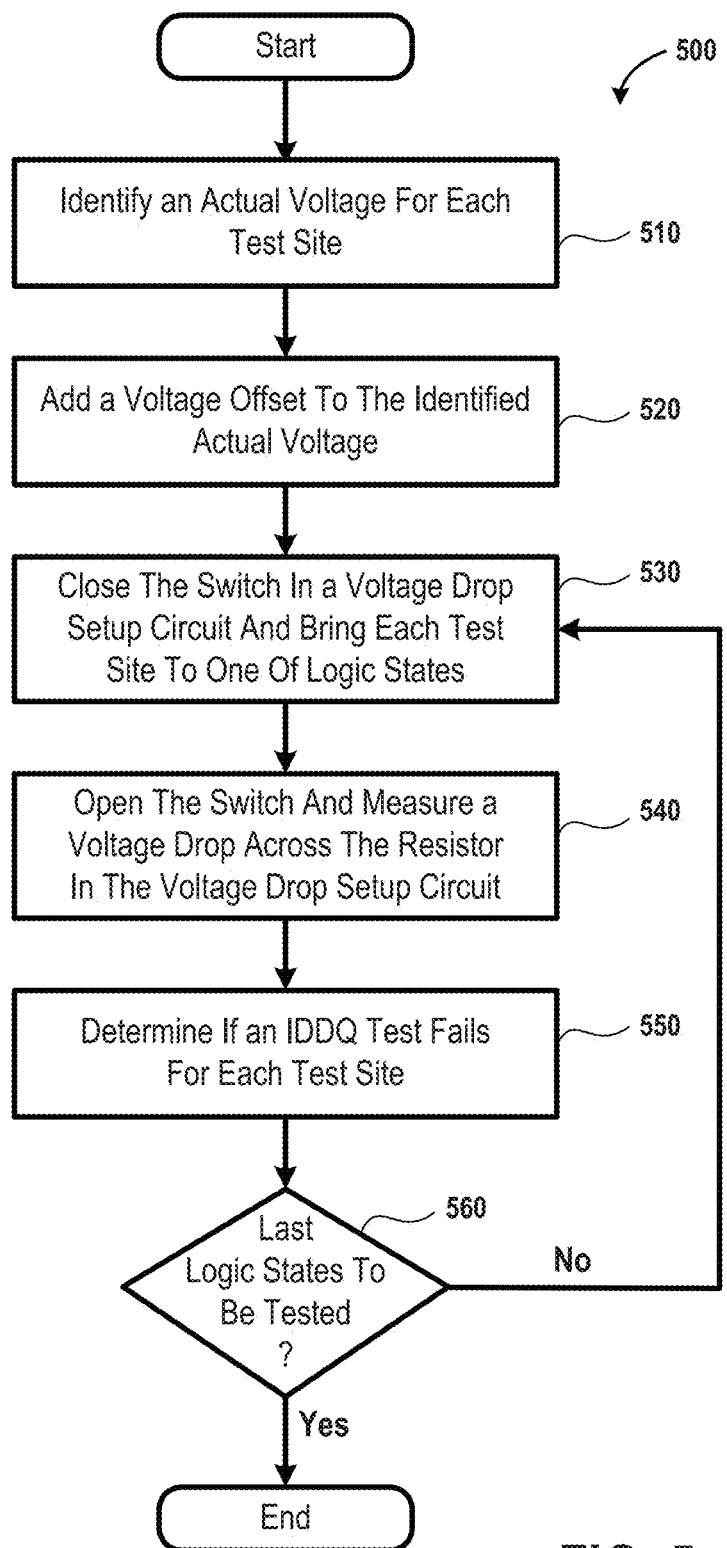
FIG. 5 illustrates a flow diagram of an exemplary method for conducting IDDQ tests for a testing device having a plurality of test sites, in accordance with one embodiment of the present disclosure.

FIG. 5 illustrates a flow diagram of an exemplary method 500 for conducting IDDQ tests for a testing device having a plurality of test sites, in accordance with one embodiment of the present disclosure. In one embodiment, the illustrated exemplary method 500 is described in relation to operations performed by the IDDQ test system 300, as shown in FIG. 3.

At the beginning of an IDDQ test, voltage ranges for each test site need to be identified. Because each die may have different normal leakage value, the test is trying to identify if logic states exist at which the leakage current deviates significantly, e.g., bigger than 20 uA, from the normal background current. The voltage ranges that reflect each test site normal background current may be different. In one embodiment, the voltage range identification process includes (1) identifying an actual voltage that reflects the normal background leakage current, for each test site in the testing device; (2) adding a voltage offset to the actual voltage. This offset voltage reflects a limit to the normal voltage (found in operation (1)) that the voltage must not reach. In this exemplary method 500, the voltage range identification process is shown in operation 510 and operation 520.

In operation 510, the actual voltage that reflects the normal background leakage for each test site in the testing device is identified. In one embodiment, the actual voltage for each test site is voltage output high ("VOH"). In another embodiment, the actual voltage for each test site is voltage output low ("VOL"). In one embodiment, the actual voltage of each test site is identified by running a calibration process.

In operation 520, a voltage offset is added to the identified actual voltage that represents the normal background current. In one embodiment, the voltage offset is about 20 mv. Since the value of the resistor R in a voltage drop setup circuit is about 1 kohm, the voltage drop of 20 mV corresponds to additional, faulty IDDQ current, of 20 uA Dies that will exhibit voltage drop higher than normal background voltage offsetted by 20 mV will be disqualified as IDDQ failure. In operation 530, the switch in each voltage drop setup circuit is closed and the test site coupled with the voltage drop setup circuit is brought to one of logic states.

In operation 540, the switch in each voltage drop setup circuit is opened and the voltage drop across the resistor in the voltage drop setup circuit is measured. In one embodiment, the leakage current may be obtained by dividing the voltage drop across the resistor with the value of the resistor.

In operation 550, the determination of whether an IDDQ test fails for a test site is made. In one embodiment, if the leakage current from a test site, obtained in operation 540, exceeds a pre-determined current value, the IDDQ test for the test site at this particular logic state is considered failed. In one embodiment, when the resistor R in the voltage drop setup circuit is about 1 kohm, the per-determined current value is about 20 uA. In operation 560, if the logic state just tested is the last logic state to be tested, the IDDQ test process will end. Otherwise, the IDDQ test process will proceed back to operation 530. The operations 530, 540, and 550 are repeated until all or pre-determined logic states of each test site are tested.

The disclosed embodiments, which utilize the fast voltage measurements instead of slow current measurements, may reduce the average IDDQ test time for 48 parallelly test devices from about 12 seconds to about 0.5 seconds. Since the invention may be implemented on silicon devices where the voltage measurement circuitry already exists, the disclosed embodiments may be implemented for fast on-chip memory defect testing, power down and standby current testing, thus saving even more test time.

The invention described herein can be embodied as computer readable code on a computer readable medium. For example, the computer readable code can include a layout data file within which one or more layouts corresponding to system 100 and/or host POR control circuit 103 are stored. The computer readable medium mentioned herein is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for conducting IDDQ tests for a plurality of devices under test (DUTs) having a plurality of test sites, each DUT having a test site, comprising:
   (a) identifying voltage ranges for each of the plurality of test sites;
   (b) closing a switch in each of a plurality of voltage drop setup circuits, wherein each of the plurality of voltage drop setup circuits includes a resistor parallelly connected to the switch, and a first terminal of each of the plurality of voltage drop setup circuits is connected to a voltage source and a second terminal of each of the plurality of voltage drop setup circuits is connected to respective tester channels of each of the plurality of test sites;
   (c) setting each of the plurality of test sites to one of a plurality of logic states;
   (d) opening the switch in each of the plurality of voltage drop setup circuits;
   (e) measuring a voltage drop across the resistor in each of the plurality of voltage drop setup circuits;
   (f) determining if an IDDQ test fails for each of the plurality of test sites when a leakage current for each of the plurality of test sites exceeds a pre-determined current value by using the measured voltage drop across the resistor; and
   (g) repeating operations (b) through (f) until all of the plurality of logic states to be tested for each of the plurality of test sites are tested, wherein the method is executed by a processor.

2. The method of claim 1, wherein the identifying of the voltage ranges for each of the plurality of test sites includes:
   identifying an actual voltage for each of the plurality of test sites that reflects a normal background leakage current; and
   adding a voltage offset that reflects an excess of the leakage current which needs to be detected for a disqualified DUT to the actual voltage.

3. The method of claim 2, wherein the actual voltage is an actual voltage output high ("VOH").

4. The method of claim 2, wherein the actual voltage is an actual voltage output low ("VOL").

5. The method of claim 2, wherein the identifying of the actual voltage for each of the plurality of test sites is performed by a calibration process.

6. The method of claim 1, wherein the resistor in each of the plurality of voltage drop setup circuits is about 1 kohm.

7. The method of claim 6, wherein the voltage offset is about 20 mV.

8. The method of claim 6, wherein the pre-determined current value is about 20 uA.

9. The method of claim 1, wherein the leaking current is obtained by dividing the voltage drop across the resistor in each of the plurality of voltage drop setup circuits with a value of the resistor.

10. The method of claim 1, further comprising:
    identifying a test site in a DUT that fails the IDDQ test.

11. An IDDQ test circuit, comprising:
    a tester having a voltage source;
    a voltage drop setup circuit having a switch and a resistor, wherein the switch is parallelly coupled to the resistor; and
    a device under test (DUT) having a test site with a test channel, wherein a first terminal of the voltage drop setup circuit is coupled to the voltage source in the tester and a second terminal of the voltage drop setup circuit is coupled to the test channel of the test site;
    wherein the voltage drop setup circuit is embedded inside the DUT,
    wherein the tester further includes a pin electronic ("PE") comparator coupled to the second terminal of the voltage drop setup circuit via a first pad of the DUT, wherein the PE comparator is configured to measure a voltage drop across the resistor in the voltage drop setup circuit;
    wherein the IDDQ test circuit fails an IDDQ test for the test site when a leakage current for the test site exceeds a pre-determined current value using the measured voltage drop across the resistor.

12. The circuit of claim 11, wherein the switch in the voltage drop setup circuit is a NMOS.

13. An IDDQ test circuit, comprising:
    a tester having a voltage source;
    a voltage drop setup circuit having a switch and a resistor, wherein the switch is parallelly coupled to the resistor; and
    a device under test (DUT) having a test site with a test channel, wherein a first terminal of the voltage drop setup circuit is coupled to the voltage source in the tester and a second terminal of the voltage drop setup circuit is coupled to the test channel of the test site
    wherein the voltage drop setup circuit is located in a probecard;

wherein the tester further includes a pin electronic ("PE") comparator coupled to the second terminal of the voltage drop setup circuit, wherein the PE comparator is configured to measure a voltage drop across the resistor in the voltage drop setup circuit;

wherein the IDDQ test circuit fails an IDDQ test site when a leakage current for the test site exceeds a pre-determined current value using the measured voltage drop across the resistor.

14. The circuit of claim 13, wherein the voltage source in the tester is coupled to the first terminal of the voltage drop setup circuit via a second pad of the DUT.

15. The circuit of claim 13, further comprising:
an A/D circuitry inside the DUT, wherein the A/D circuitry is coupled to the second terminal of the voltage drop setup circuit and is configured to measure the voltage drop across the resister in the voltage drop setup circuit.

16. A computer readable non-transitory media having program instructions for conducting IDDQ tests for a plurality of devices under test (DUTs) having a plurality of test sites, each DUT having a test site, the computer readable non-transitory media comprising:
(a) program instructions for identifying voltage ranges for each of the plurality of test sites;
(b) program instructions for closing a switch in each of a plurality of voltage drop setup circuits, wherein each of the plurality of voltage drop setup circuits includes a resistor parallelly connected to the switch, and a first terminal of each of the plurality of voltage drop setup circuits is connected to a voltage source and a second terminal of each of the plurality of voltage drop setup circuits is connected to respective tester channels of each of the plurality of test sites;
(c) program instructions for setting each of the plurality of test sites to one of a plurality of logic states;
(d) program instructions for opening the switch in each of the plurality of voltage drop setup circuits;
(e) program instructions for measuring a voltage drop across the resistor in each of the plurality of voltage drop setup circuits;
(f) program instructions for determining if an IDDQ test fails for each of the plurality of test sites when a leakage current for each of the plurality of test sites exceeds a pre-determined current value by using the measured voltage drop across the resistor; and
(g) program instructions for repeating program instructions (b) through (f) until all of the plurality of logic states to be tested for each of the plurality of test sites are tested.

* * * * *